US010600977B2

(12) United States Patent
Cho et al.

(10) Patent No.: US 10,600,977 B2
(45) Date of Patent: Mar. 24, 2020

(54) NANOPATCH GRAPHENE COMPOSITE

(71) Applicant: CENTGER FOR ADVANCED SOFT ELECTRONICS, Pohang (KR)

(72) Inventors: Kilwon Cho, Pohang (KR); Boseok Kang, Jeongseongun (KR); Seong Kyu Lee, Pohang (KR)

(73) Assignees: CENTER FOR ADVANCED SOFT ELECTRONICS, Pohang-si (KR); POSTECH ACADEMY-INDUSTRY FOUNDATION, Pohang-si (KR)

( * ) Notice: Subject to any disclaimer, the term of this patent is extended or adjusted under 35 U.S.C. 154(b) by 16 days.

(21) Appl. No.: 15/833,090

(22) Filed: Dec. 6, 2017

(65) Prior Publication Data
US 2019/0013488 A1 Jan. 10, 2019

(30) Foreign Application Priority Data
Jul. 5, 2017 (KR) .................. 10-2017-0085343

(51) Int. Cl.
*H01L 29/08* (2006.01)
*H01L 51/40* (2006.01)
*H01L 51/05* (2006.01)
*H01L 51/00* (2006.01)
*H01L 51/10* (2006.01)

(52) U.S. Cl.
CPC ........ *H01L 51/055* (2013.01); *H01L 51/0021* (2013.01); *H01L 51/0045* (2013.01); *H01L 51/0097* (2013.01); *H01L 51/105* (2013.01); *H01L 51/0558* (2013.01)

(58) Field of Classification Search
CPC ............ H01L 29/1606; H01L 51/0021; H01L 51/0097; H01L 51/105
See application file for complete search history.

(56) References Cited

U.S. PATENT DOCUMENTS

| 8,637,346 | B1* | 1/2014 | Jung | ................... H01L 21/2815 438/99 |
| 8,932,671 | B2* | 1/2015 | Advincula | ............. B82Y 30/00 427/220 |
| 2014/0291733 | A1* | 10/2014 | Lee | .......................... G01L 1/20 257/254 |

(Continued)

OTHER PUBLICATIONS

Office Action from Korean Intellectual Property Office of 10-2017-0085343, dated Nov. 20, 2018.

(Continued)

*Primary Examiner* — Alonzo Chambliss
(74) *Attorney, Agent, or Firm* — STIP Law Group, LLC

(57) ABSTRACT

Disclosed is a nanopatch graphene composite, which includes graphene including a defect and a nanopatch positioned on the defect, and is configured such that a nanopatch is formed through a self-assembling process on the surface of graphene, thus improving the mechanical properties and durability of the graphene composite. Also, a flexible organic transistor, including the nanopatch graphene composite of the invention, is transparent and has high mechanical durability, thus exhibiting device stability, and the molecular alignment of the organic semiconductor layer growing on the nanopatch graphene composite is induced so as to become favorable for charge injection, thereby increasing the performance of the device.

12 Claims, 16 Drawing Sheets

(56) References Cited

U.S. PATENT DOCUMENTS

| | | | | |
|---|---|---|---|---|
| 2015/0014600 A1* | 1/2015 | Jeon | ................ | H01B 1/04 |
| | | | | 252/502 |
| 2015/0228479 A1* | 8/2015 | Maliakal | ............ | B82Y 30/00 |
| | | | | 423/448 |
| 2017/0047558 A1* | 2/2017 | Lee | ................ | H01L 51/56 |
| 2018/0190949 A1* | 7/2018 | Lee | ................ | H01L 51/56 |
| 2019/0165120 A1* | 5/2019 | Sato | ............ | H01L 21/02126 |

OTHER PUBLICATIONS

B, Lee et al, Modification of Electronic Properties of Graphene with Self-Assembled Monolayers, Nano letters, May 26, 2010, pp. 2427-2432, vol. 10, American Chemical Society, Washington DC, USA.

* cited by examiner

【FIG. 1A】
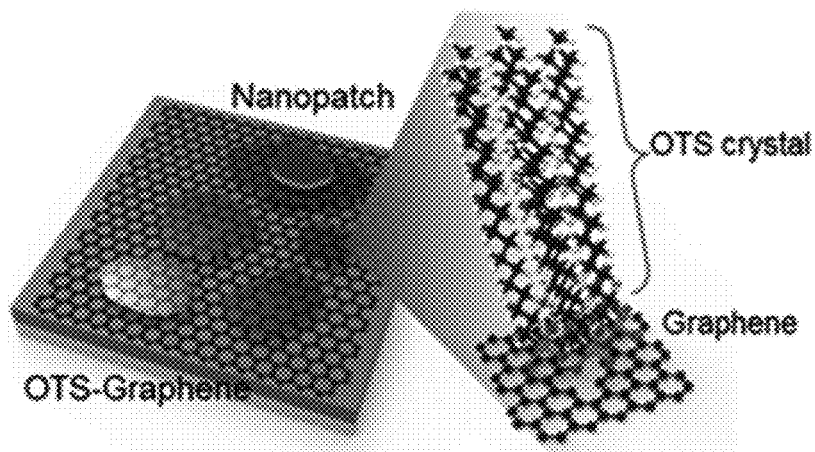
【FIG. 1B】
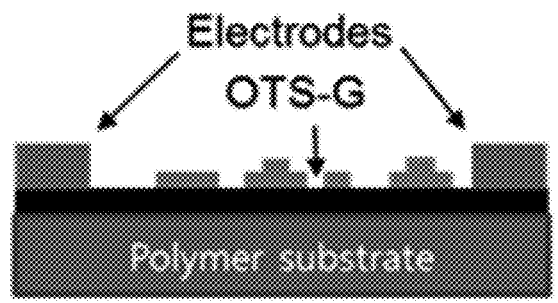
【FIG. 1C】
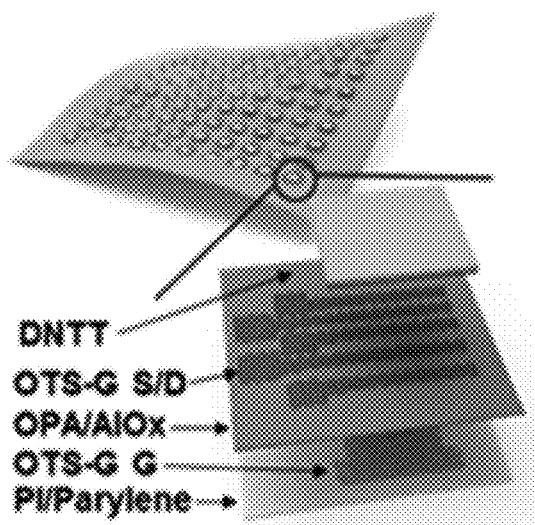

[FIG. 2]
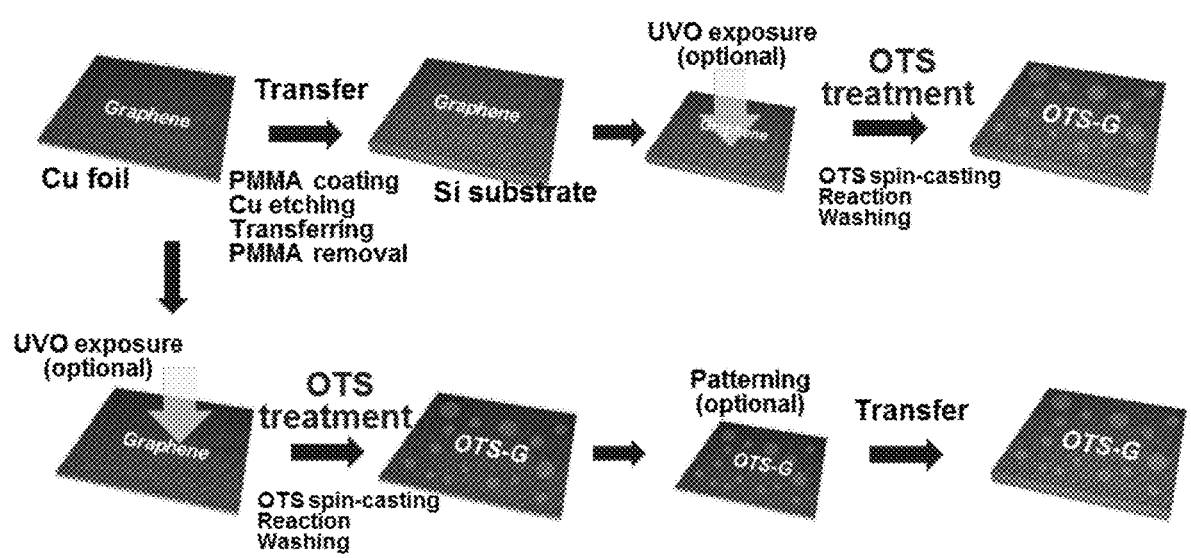

[FIG. 3]
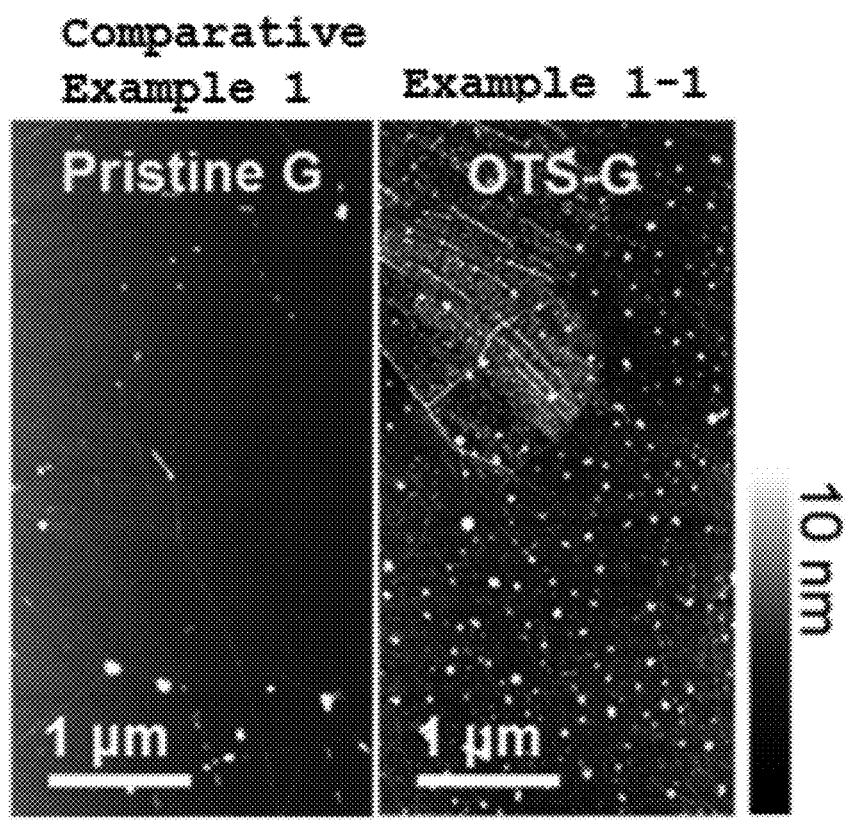

[FIG. 4A]
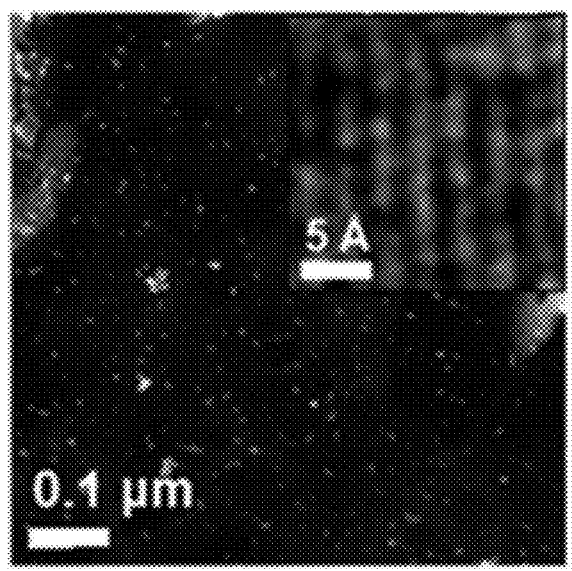
[FIG. 4B]
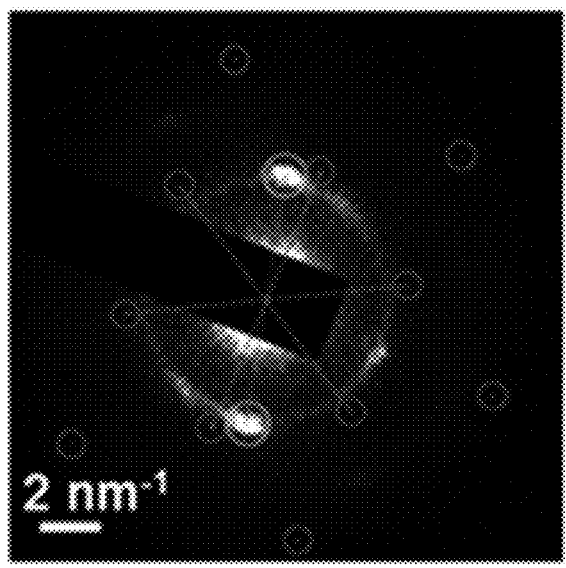

[FIG. 4C]
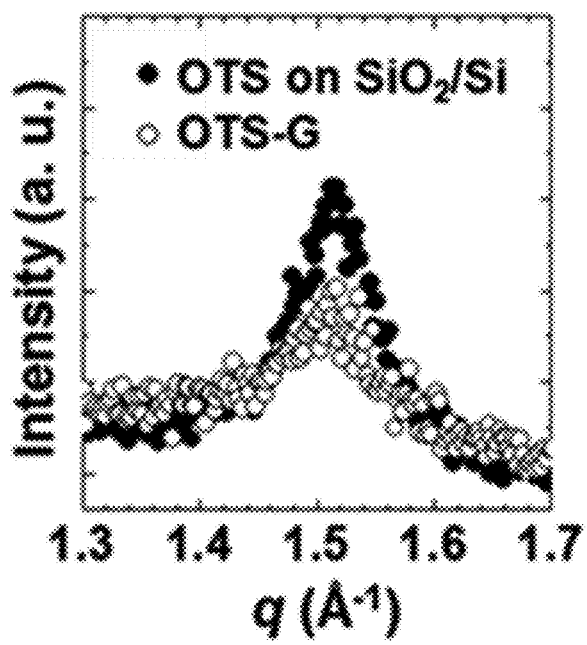
[FIG. 4D]
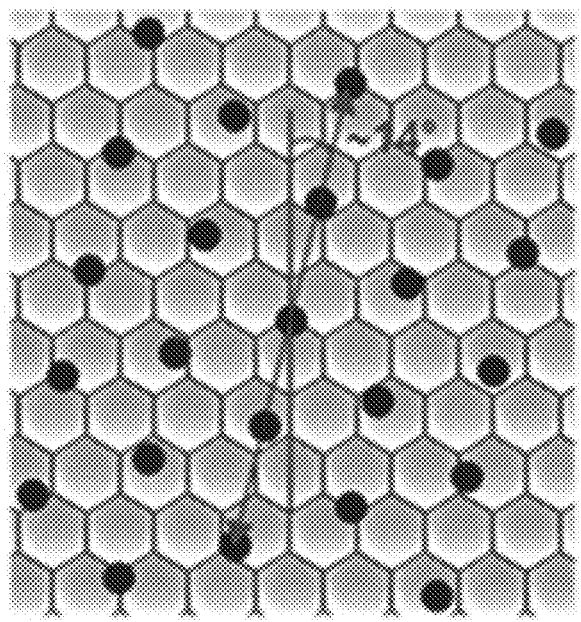

[FIG. 5]
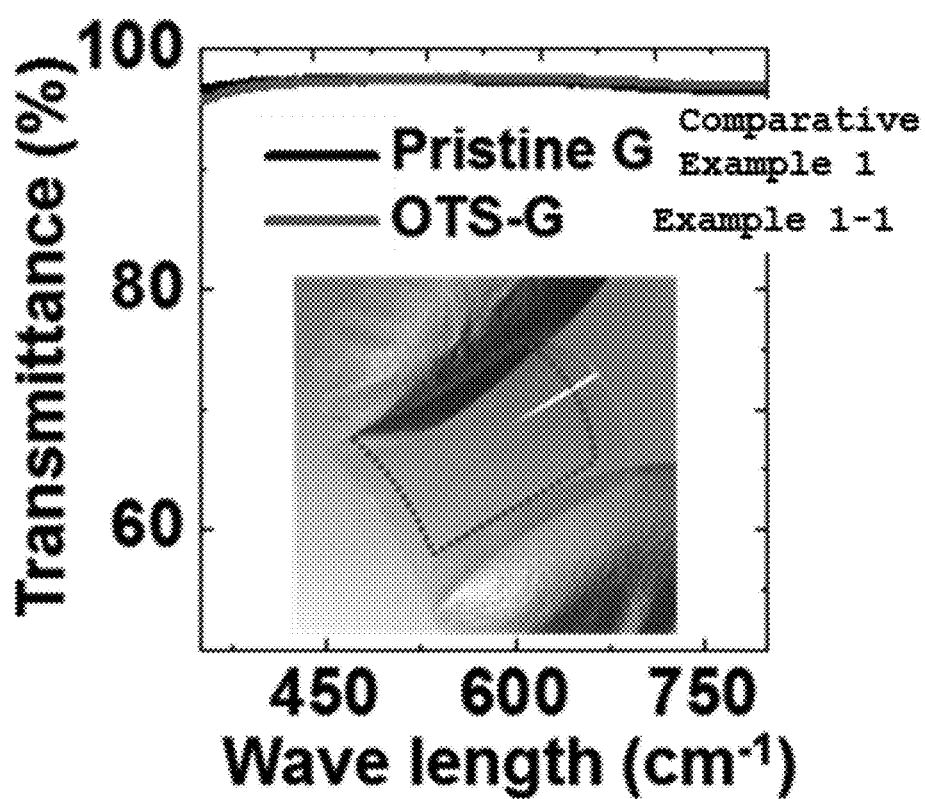

[FIG. 6A]
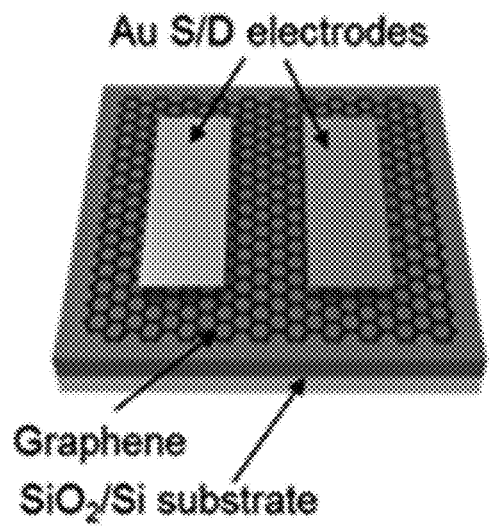
[FIG. 6B]
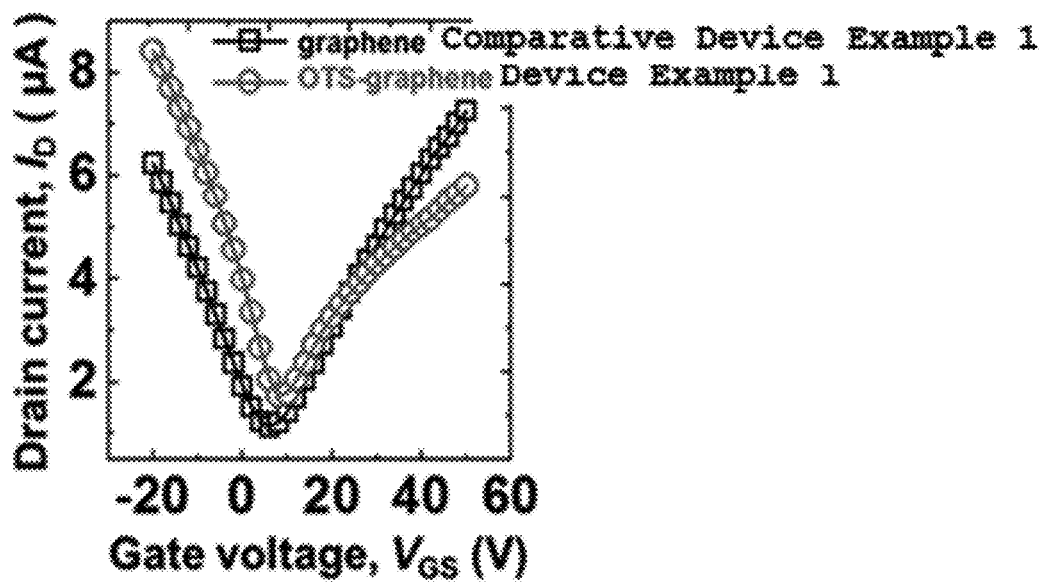

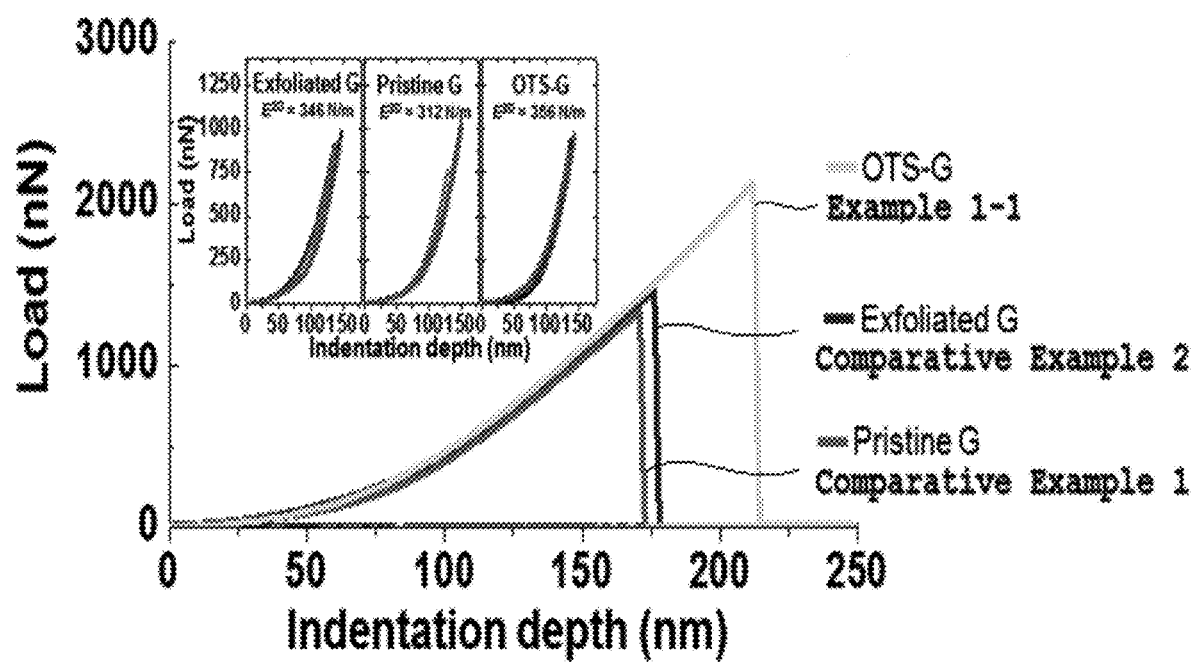
[FIG. 7A]

[FIG. 7B]
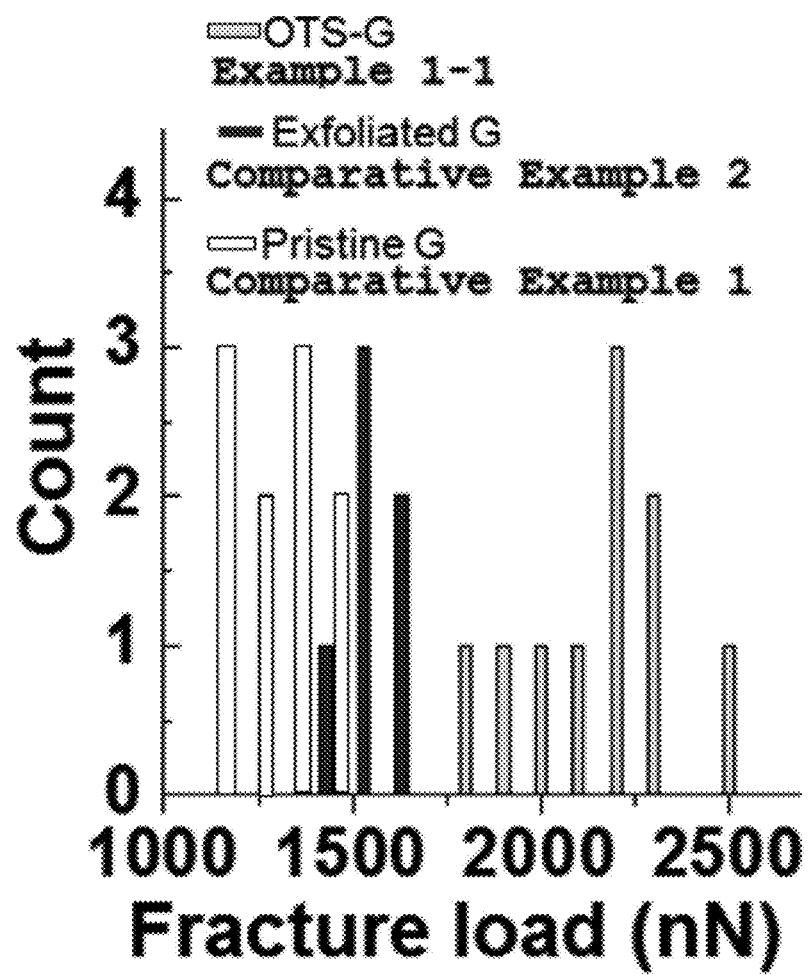

[FIG. 8A]
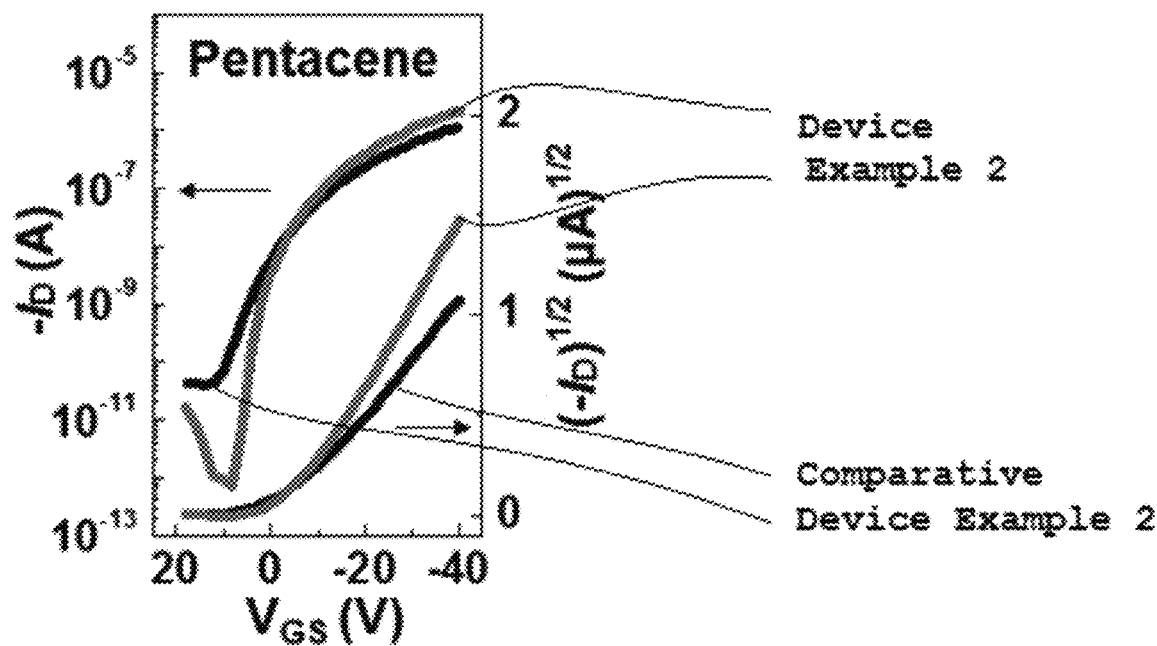
[FIG. 8B]
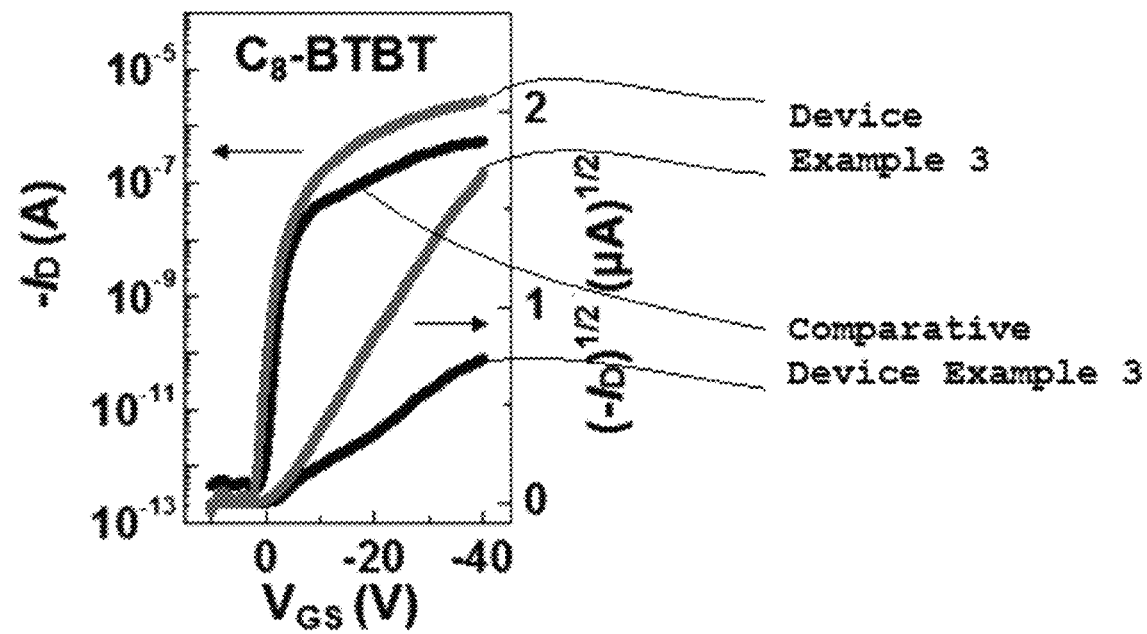

[FIG. 8C]
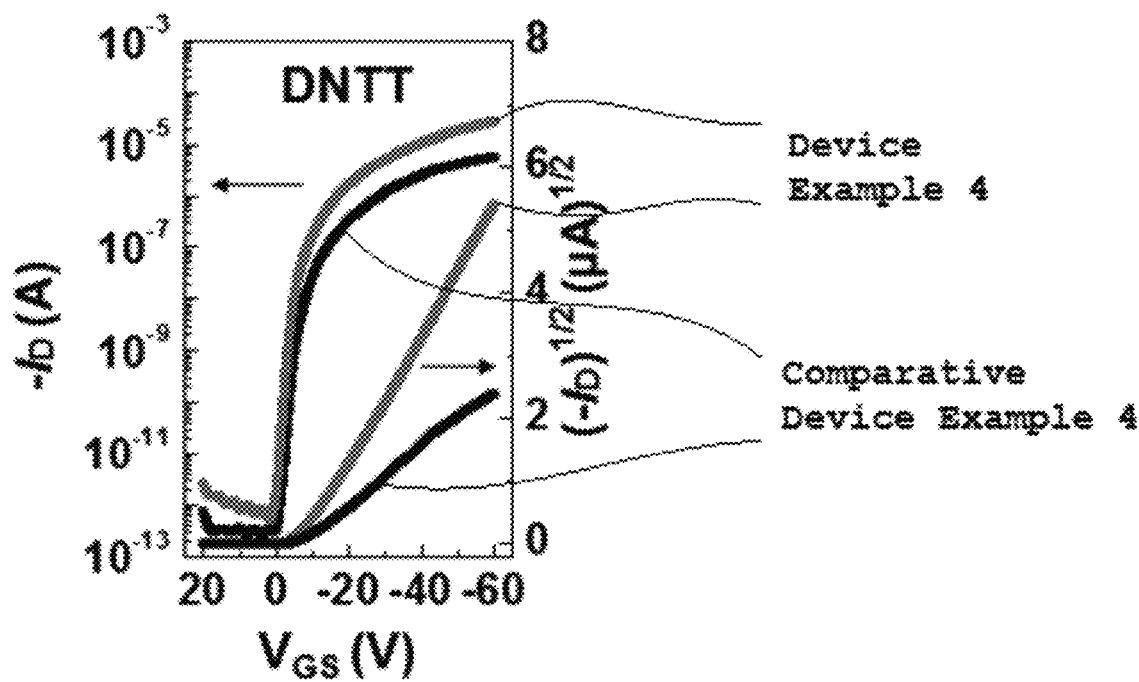

[FIG. 9]
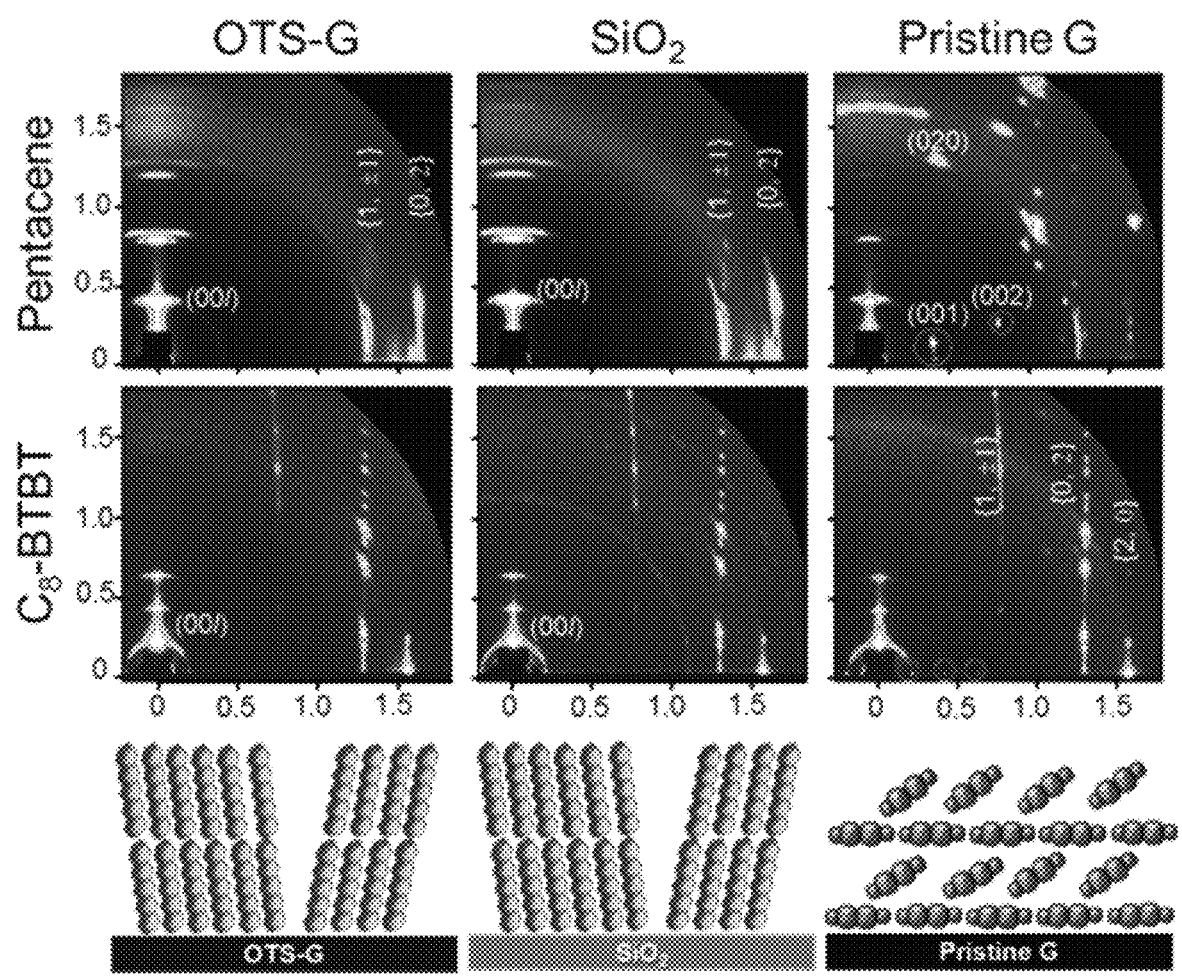

[FIG. 10]
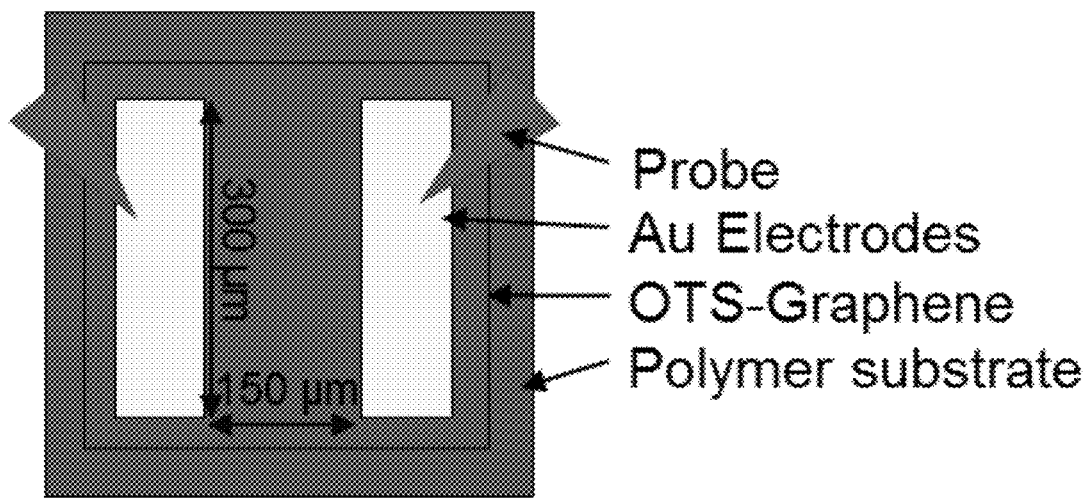

[FIG. 11A]
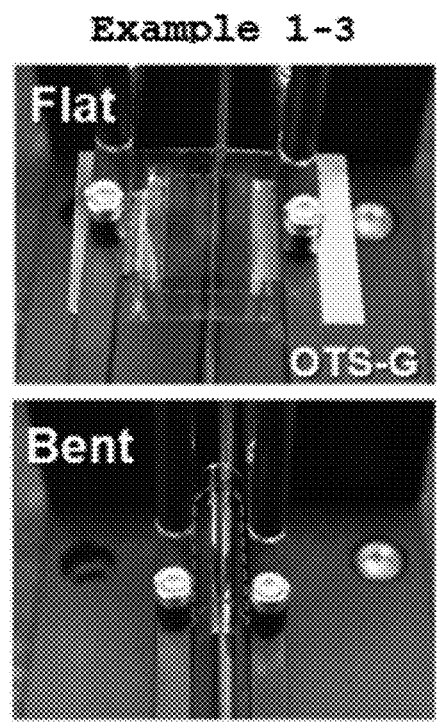
[FIG. 11B]
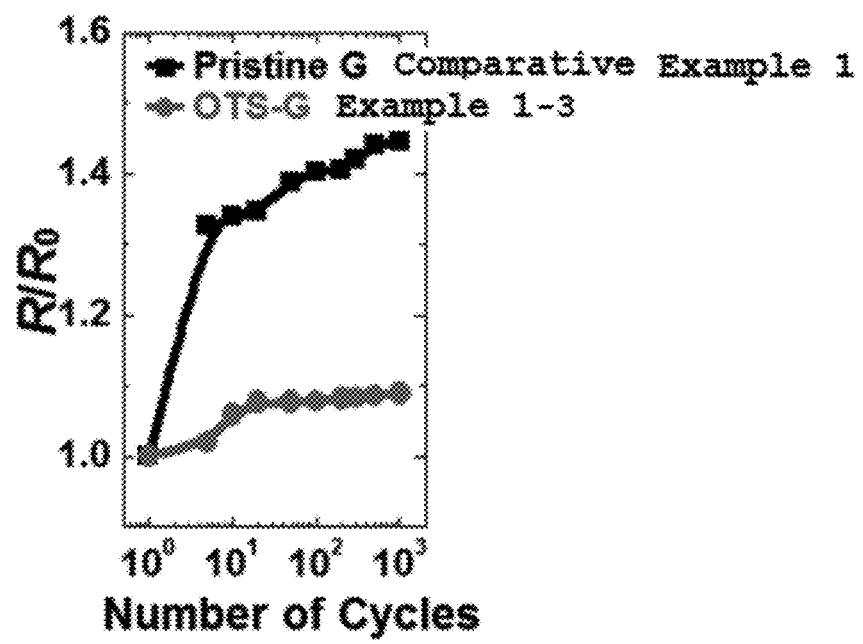

[FIG. 12A]
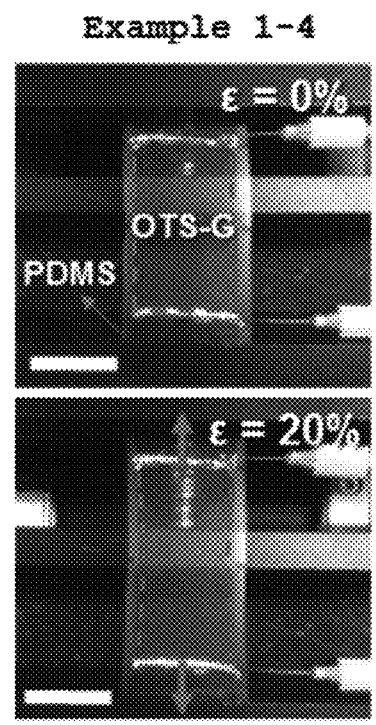
[FIG. 12B]
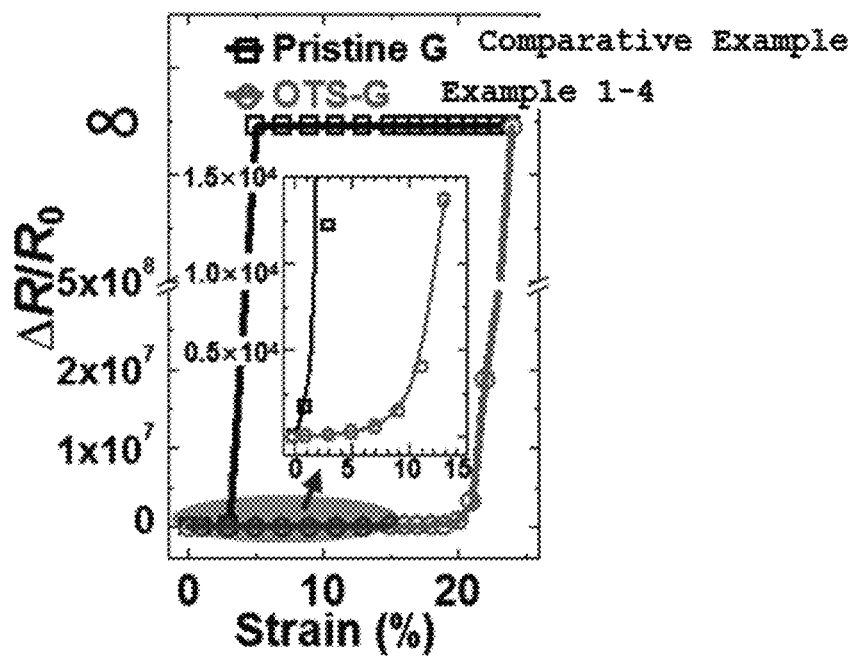

[FIG. 13A]
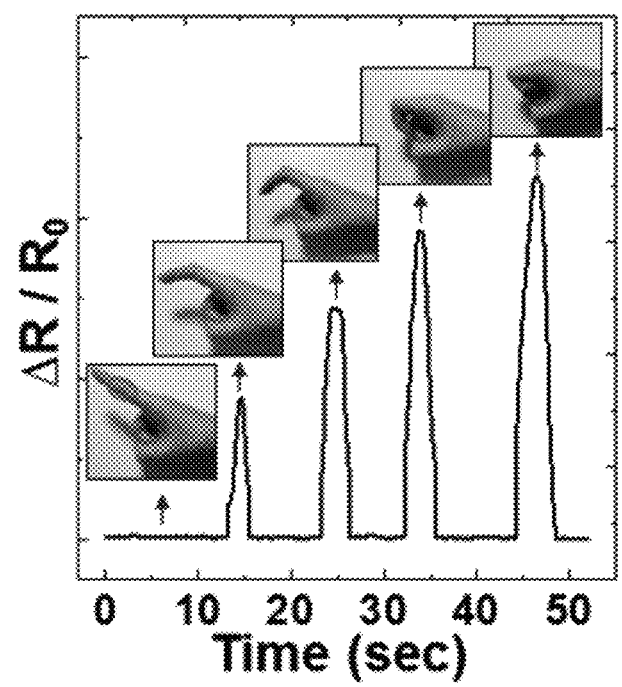
[FIG. 13B]
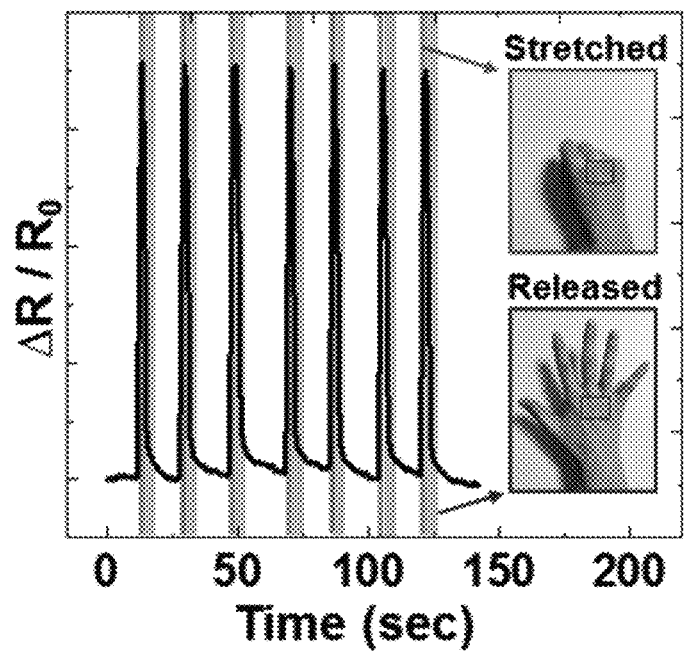

NANOPATCH GRAPHENE COMPOSITE

CROSS-REFERENCE TO RELATED APPLICATION

This application claims the benefit of Korean Patent Application No. 10-2017-0085343, filed on Jul. 5, 2017, the disclosure of which is incorporated herein in its entirety by reference.

BACKGROUND OF THE INVENTION

1. Technical Field

The present invention relates to a nanopatch graphene composite and a method of manufacturing the same, and more particularly to a nanopatch graphene composite, which is configured such that a nanopatch is formed through a self-assembling process on the surface of graphene, thus improving the mechanical properties and durability of the graphene composite, whereby the mechanical stability of a next-generation flexible electronic device may be increased, and to a method of manufacturing the same.

2. Description of the Related Art

Graphene, which is a two-dimensional material comprising an $sp^2$ carbon monolayer, exhibits superior optical, thermal, mechanical and electrical properties, and is thus receiving attention as a next-generation material for a soft electronic device. In order to commercialize graphene, there is a need to solve problems related to 1) the synthesis and transfer of graphene having a large area and high quality, 2) the analysis of basic graphene properties, 3) the development of a process of fabricating a graphene-based device and 4) the optimization of graphene properties for a high-performance device. Among these problems, the production of graphene having a large area and high quality on a desired substrate is regarded as very important. A chemical vapor deposition process enables graphene having a large area and high quality to be synthesized on a catalyst metal, and is thus considered to be very suitable for commercializing graphene. However, since graphene is grown on the catalyst metal, the transfer thereof on the desired substrate is essentially required. During the transfer of graphene, the properties of graphene may be greatly deteriorated, and thus not only the synthesis of graphene but also the transfer thereof are important. Many attempts have been made to perform various transfer methods using polymethyl methacrylate (PMMA) as a transfer support layer so as to transfer graphene having a large area and high quality, but micrometer-scale graphene defects are generated. Thereby, poor properties compared to the inherent properties of graphene may be obtained, and in particular, mechanical durability is greatly decreased. When a flexible electronic device is manufactured using such defective graphene material, the stability and reliability of the device may also decrease. In order to solve such problems, introducing the support layer or increasing the bondability to the substrate may be conducted, but a complicated additional process has to be inevitably carried out, and hence, limitations are imposed on selection of the substrate.

SUMMARY OF THE INVENTION

Accordingly, the present invention has been made keeping in mind the problems encountered in the related art, and the present invention is intended to provide a nanopatch graphene composite and a method of manufacturing the same, in which the nanopatch graphene composite is configured such that a nanopatch is formed through a self-assembling process on the surface of graphene, thus improving the mechanical properties and durability of the graphene composite, W whereby the mechanical stability of a next-generation flexible electronic device may be increased.

An aspect of the present invention provides a nanopatch graphene composite, comprising graphene including a defect and a nanopatch disposed on the defect.

The defect may be at least one selected from the group consisting of a grain boundary, a dot defect, a line defect, cracking, folding, and wrinkling.

The nanopatch may include a self-assembled monolayer (SAM).

The self-assembled monolayer may be formed by self-assembling, on the defect, a compound represented by Chemical Formula 1 below:

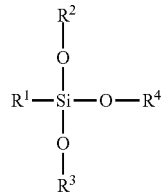

[Chemical Formula 1]

in Chemical Formula 1,
$R^1$ is a C3 to C30 alkyl group,
$R^2$ and $R^3$, which are identical to or different from each other, are independently a hydrogen atom or a C1 to C6 alkyl group, and
$R^4$ is a C1 to C6 alkyl group.

The compound represented by Chemical Formula 1 may be octadecyltrimethoxysilane (OTS).

The nanopatch may suppress or delay the fracture of the graphene growing on the defect upon transforming the graphene.

The graphene may be at least one selected from the group consisting of single-layer graphene, double-layer graphene and multilayer graphene.

Another aspect of the present invention provides an organic transistor, comprising: a flexible substrate; a semiconductor layer on the substrate; and a gate electrode, a source electrode and a drain electrode, wherein at least one selected from the group consisting of the gate electrode, the source electrode and the drain electrode includes the nanopatch graphene composite as above.

The flexible substrate may be at least one selected from the group consisting of polydimethylsiloxane, polyimide, polyethylene terephthalate, polyethylene naphthalate, polypropylene, polyethylene, polyamide and fiberglass-reinforced plastic.

Still another aspect of the present invention provides a flexible strain sensor, comprising: a flexible substrate; an active layer formed on the flexible substrate and including the nanopatch graphene composite as above; and an electrode electrically connected to the active layer.

Yet still another aspect of the present invention provides a method of manufacturing a nanopatch graphene composite, comprising: (a) providing graphene including a defect; (b) oxidizing the graphene to bond a functional group containing an oxygen atom onto the defect, thus obtaining surface-modified graphene; and (c) bonding a self-assembled monolayer to the functional group, thus obtaining the nanopatch graphene composite.

In step (c), the self-assembled monolayer may be formed by self-assembling a compound represented by Chemical Formula 1 below:

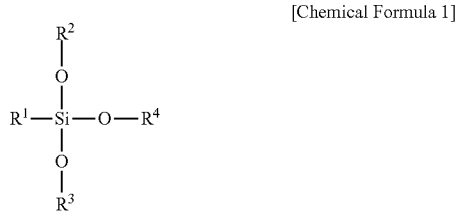

[Chemical Formula 1]

in Chemical Formula 1, $R^1$ is a C3 to C30 alkyl group, $R^2$ and $R^3$, which are identical to or different from each other, are independently a hydrogen atom or a C1 to C6 alkyl group, and $R^4$ is a C1 to C6 alkyl group.

The oxidizing may be selectively carried out on the defect of the graphene.

The oxidizing may be performed using UV/ozone.

According to the present invention, a nanopatch graphene composite is configured such that a nanopatch is formed through a self-assembling process on the surface of graphene, thus improving the mechanical properties and the durability of the graphene composite.

Also according to the present invention, a flexible organic transistor, including the nanopatch graphene composite of the invention, is transparent and has high mechanical durability, thus exhibiting device stability, and the molecular alignment of the organic semiconductor layer growing on the nanopatch graphene composite is induced so as to become favorable for charge injection, thereby increasing the performance of the device.

BRIEF DESCRIPTION OF DRAWINGS

FIG. 1A shows the structure of a nanopatch graphene composite according to the present invention, FIG. 1B shows the structure of a flexible strain sensor including the nanopatch graphene composite, and FIG. 1C shows the structure of a flexible organic transistor including the nanopatch graphene composite;

FIG. 2 is a flowchart showing a process of manufacturing a nanopatch graphene composite according to the present invention;

FIG. 3 shows AFM images of Example 1-1 and Comparative Example 1;

FIG. 4A shows a STEM image using an energy dispersive spectrometer (EDS) of the nanopatch graphene composite of Example 1-1, FIG. 4B shows the selected area electron diffraction (SAED) pattern thereof, FIG. 4C shows the results of measurement of grazing incidence X-ray diffraction (GIXD) thereof, and FIG. 4D is an image showing the epitaxial structure of the self-assembled nanopatch layer in graphene;

FIG. 5 shows the results of analysis of UV-vis spectra of Example 1-1 and Comparative Example 1;

FIG. 6A schematically shows a graphene field emission transistor, and FIG. 6B shows the results of performance of the field emission transistors of Device Example 1 and Comparative Device Example 1;

FIG. 7A shows the results of nanoindentation of Example 1-1 and Comparative Examples 1 and 2, and FIG. 7B shows the histogram of fracture loads to compare mechanical properties;

FIGS. 8A, 8B and 8C show the transfer curves for performance difference of the organic transistors of Device Example 2 and Comparative Device Example 2 (FIG. 8A), Device Example 3 and Comparative Device Example 3 (FIG. 8B), and Device Example 4 and Comparative Device Example 4 (FIG. 8C);

FIG. 9 shows the two-dimensional grazing incidence X-ray diffraction patterns of Device Examples 2 and 3 and Comparative Device Examples 2 and 3;

FIG. 10 is a schematic view for measurement of resistance of the nanopatch graphene composites of Examples 1-1 and 1-2;

FIG. 11A shows the bending test system of a bending radius of 5 mm in Example 1-3 and Comparative Example 1, and FIG. 11B is a graph showing how conductivity is maintained under a bending strain of 5 mm;

FIG. 12A shows a stretching test system (scale bar, 2 cm) using a PDMS substrate of Example 1-4 and Comparative Example 1, and FIG. 12B is a graph showing how the conductivity is maintained under tensile strain; and FIGS. 13A and 13B are graphs showing changes in resistance depending on the movement of Device Example 5 attached to the finger and the back of the hand, respectively.

DESCRIPTION OF SPECIFIC EMBODIMENTS

The present invention may be embodied in many different forms and should not be construed as being limited only to the embodiments set forth herein, but should be construed as covering modifications, equivalents or alternatives falling within the ideas and technical scope of the present invention. In the description of the present invention, detailed descriptions of related known techniques incorporated herein will be omitted when it may make the gist of the present invention unclear.

As used herein, the terms "first", "second", etc. may be used to describe various elements, but these elements are not to be limited by these terms. These terms are only used to distinguish one element from another. For example, a first element may be termed a second element, and, similarly, a second element may be termed a first element, without departing from the scope of exemplary embodiments of the present invention.

Further, it will be understood that when an element is referred to as being "formed" or "layered" on another element, it can be formed or layered so as to be directly attached to the entire surface or one surface of the other element, or intervening elements may be present therebetween.

Unless otherwise stated, the singular expression includes a plural expression. In this application, the terms "include" or "have" are used to designate the presence of features, numbers, steps, operations, elements, parts, or combinations thereof described in the specification, and should be understood as not excluding the presence or additional probability of one or more different features, numbers, steps, operations, elements, parts, or combinations thereof.

FIG. 1A shows the structure of a nanopatch graphene composite according to the present invention, FIG. 1B shows the structure of a flexible strain sensor including the nanopatch graphene composite, and FIG. 1C shows the structure of a flexible organic transistor including the nanopatch graphene composite.

Below is a description of the nanopatch graphene composite according to the present invention with reference to FIGS. 1A to 1C.

The present invention addresses a nanopatch graphene composite, comprising graphene including a defect and a nanopatch disposed on the defect.

The defect may be at least one selected from the group consisting of a grain boundary, a dot defect, a line defect, cracking, folding, and wrinkling.

The nanopatch may include a self-assembled monolayer (SAM).

The self-assembled monolayer may be formed by self-assembling, on the defect, a compound represented by Chemical Formula 1 below:

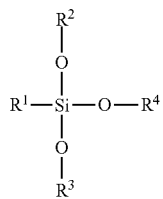

[Chemical Formula 1]

in Chemical Formula 1,
$R^1$ is a C3 to C30 alkyl group,
$R^2$ and $R^3$, which are identical to or different from each other, are independently a hydrogen atom or a C1 to C6 alkyl group, and
$R^4$ is a C1 to C6 alkyl group.

The compound represented by Chemical Formula 1 may be octadecyltrimethoxysilane (OTS).

The nanopatch may suppress or delay the fracture of the graphene growing on the defect upon transforming the graphene.

The graphene may be at least one selected from the group consisting of single-layer graphene, double-layer graphene and multilayer graphene.

In addition, the present invention addresses an organic transistor, comprising: a flexible substrate; a semiconductor layer on the substrate; and a gate electrode, a source electrode and a drain electrode, wherein at least one selected from the group consisting of the gate electrode, the source electrode and the drain electrode includes the nanopatch graphene composite of the invention.

The flexible substrate may be at least one selected from the group consisting of polydimethylsiloxane, polyimide, polyethylene terephthalate, polyethylene naphthalate, polypropylene, polyethylene, polyamide, and fiberglass-reinforced plastic.

In addition, the present invention addresses a flexible strain sensor, comprising: a flexible substrate; an active layer formed on the flexible substrate and including the nanopatch graphene composite of the invention; and an electrode electrically connected to the active layer.

FIG. 2 is a flowchart showing the process of manufacturing the nanopatch graphene composite according to the present invention.

Below, the method of manufacturing the nanopatch graphene composite according to the present invention is described below with reference to FIG. 2.

Specifically, graphene including a defect is provided (step a).

Next, the graphene is oxidized to bond a functional group containing an oxygen atom onto the defect, thus obtaining surface-modified graphene (step b).

The oxidizing may be selectively carried out on the defect of the graphene.

The oxidizing may be performed using UV/ozone.

Next, a self-assembled monolayer is attached to the functional group, thus obtaining the nanopatch graphene composite (step c).

In step c, the self-assembled monolayer may be formed by self-assembling a compound represented by Chemical Formula 1 below:

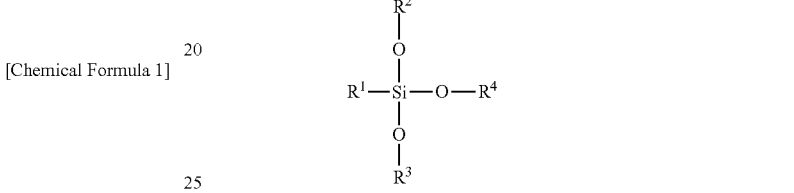

[Chemical Formula 1]

in Chemical Formula 1,
$R^1$ is a C3 to C30 alkyl group,
$R^2$ and $R^3$, which are identical to or different from each other, are independently a hydrogen atom or a C1 to C6 alkyl group, and
$R^4$ is a C1 to C6 alkyl group.

EXAMPLES

A better understanding of the present invention will be given through the following Examples, which are merely set forth to illustrate, but are not to be construed as limiting the scope of the present invention.

Example 1-1: Manufacture of Nanopatch Graphene Composite Through Formation of Self-Assembled Monolayer Followed by Transfer Thereof onto SiO$_2$/Si Wafer A copper foil (Alfa Aesar, product No.: 13382) was placed in a quartz chamber and heated to 1000° C. at a pressure of 50 mTorr for 1 hr in the presence of hydrogen gas of 10 sccm (standard cubic centimeters per minute), whereby the surface thereof was reduced. Next, methane gas of 45 sccm was allowed to flow at a pressure of 300 mTorr for 30 min. Subsequently, the quartz chamber was rapidly cooled, and a single-layer graphene thin film was thus formed on the copper foil.

The single-layer graphene thin film was patterned through photolithography, after which the surface of the graphene was treated with UV/ozone for 3 min. A 3 mM OTS solution, prepared by stirring 10 mL of 1,1,2-trichloroethylene (Sigma-Aldrich) solution and 12 µL of octadecyltrimethoxysilane (Gelest, Inc.) solution, was applied on the graphene substrate through a spin-coating process, after which an ammonia water atmosphere was created in the chamber and the sample was stored therein for about 10 hr, thereby inducing the covalent bonding of the OTS molecule and the graphene surface. Thereafter, the sample was taken out of the chamber, and unreacted OTS molecules were washed off from the graphene surface with an acetone solution, followed by drying. Finally, the graphene thin film on the copper foil was transferred onto a SiO$_2$/Si wafer, thereby manufacturing a nanopatch graphene composite (OTS-Graphene, OTS-G).

Example 1-2: Manufacture of Nanopatch Graphene Composite Through Transfer of Graphene onto SiO$_2$/Si Wafer Followed by Formation of Self-Assembled Monolayer A copper foil (Alfa Aesar, product No.: 13382) was placed in a quartz chamber and heated to 1000° C. at a pressure of 50 mTorr for 1 hr in the presence of hydrogen gas of 10 sccm (standard cubic centimeters per minute), whereby the surface thereof was reduced. Next, methane gas of 45 sccm was allowed to flow at a pressure of 300 mTorr for 30 min. Subsequently, the quartz chamber was rapidly cooled, and a single-layer graphene thin film was thus formed on the copper foil.

The single-layer graphene thin film formed on the copper foil was spin-coated with a poly(methyl methacrylate) film (Aldrich, PMMA product No.: 162265, Mw=996 kg mol$^{-1}$), and graphene present on the surface opposite the coating surface was removed through oxygen plasma. The PMMA/graphene/copper foil was floated on the surface of an aqueous solution containing 0.1 M ammonium sulfate ((NH$_4$)$_2$S$_2$O$_8$) to remove the copper foil, and the PMMA/graphene film was transferred to deionized water. Next, the PMMA/graphene film was transferred onto a SiO$_2$/Si wafer having a thickness of 300 nm and then baked at 120° C., and PMMA was removed with acetone. Subsequently, patterning was performed through photolithography.

Thereafter, in order to functionalize the graphene surface, UV/ozone treatment (AH1700, Ahtech LTS) was conducted for 3 min. A 3 mM OTS solution, prepared by stirring 10 mL of 1,1,2-trichloroethylene (Sigma-Aldrich) solution and 12 μL of octadecyltrimethoxysilane (Gelest, Inc.) solution, was applied on the graphene substrate through a spin-coating process, after which an ammonia water atmosphere was created in the chamber and the sample was stored therein for about 10 hr, thereby inducing the covalent bonding of the OTS molecule and the graphene surface. Thereafter, the sample was taken out of the chamber, and unreacted OTS molecules were washed off from the graphene surface with deionized water, isopropyl alcohol (IPA) and an acetone solution, followed by drying. Finally, a nanopatch graphene composite (OTS-Graphene, OTS-G) on a SiO$_2$/Si wafer was manufactured.

Example 1-3: Nanopatch Graphene Composite Formed on Polyethylene Terephthalate (PET)

A nanopatch graphene composite (OTS-Graphene, OTS-G) formed on polyethylene terephthalate (PET) was manufactured in the same manner as in Example 1-1, with the exception that the graphene thin film on the copper foil was transferred onto the polyethylene terephthalate (PET), in lieu of transferring the graphene thin film on the copper foil onto the SiO$_2$/Si wafer.

Example 1-4: Nanopatch Graphene Composite Formed on Polydimethylsiloxane (PDMS)

A nanopatch graphene composite (OTS-Graphene, OTS-G) formed on polydimethylsiloxane (PDMS) was manufactured in the same manner as in Example 1-1, with the exception that the graphene thin film on the copper foil was transferred onto the polydimethylsiloxane (PDMS), in lieu of transferring the graphene thin film on the copper foil onto the SiO$_2$/Si wafer.

Comparative Example 1: Pristine Graphene Thin Film (Pristine Graphene)

A copper foil (Alfa Aesar, product No.: 13382) was placed in a quartz chamber and heated to 1000° C. at a pressure of 50 mTorr for 1 hr in the presence of hydrogen gas of 10 sccm, whereby the surface thereof was reduced. Next, methane gas of 45 sccm was allowed to flow at a pressure of 300 mTorr for 30 min. Subsequently, the quartz chamber was rapidly cooled, and thus a pristine graphene thin film on the copper foil was manufactured. The grown single-layer graphene thin film was transferred onto a silicon wafer (or a polymer substrate) using the PMMA support layer.

Comparative Example 2: Exfoliated Graphene

Exfoliated graphene was manufactured by exfoliating graphene from graphite (Kish graphite, Covalent Materials Inc.) using the adhesive force of Scotch tape.

Device Example 1: Fabrication of Field Emission Transistor Including Nanopatch Graphene Composite A field emission transistor including the nanopatch graphene composite was fabricated by thermally depositing, as a source electrode and a drain electrode, a 60 nm-thick Au electrode (L=150 m, W=300 μm) on the nanopatch graphene composite manufactured in Example 1-1.

Fabrication of Flexible Organic Transistor

Device Example 2: Fabrication of Flexible Organic Transistor Including Nanopatch Graphene Composite A 2.5 μm-thick perylene thin film was thermally deposited in a vacuum on a silicon wafer. On the perylene/silicon wafer substrate, a 2 μm-thick polyimide layer was applied through spin coating. On the polyimide/perylene/silicon wafer substrate, the gate electrode-patterned nanopatch graphene composite (OTS-G) of Example 1-1 was introduced. On the gate electrode-patterned nanopatch graphene composite/polyimide/perylene/silicon wafer substrate, an aluminum oxide insulating layer was deposited to a thickness of 30 to 100 nm through ALD (Atomic Layer Deposition). On the AlO$_x$/gate electrode-patterned nanopatch graphene composite/polyimide/perylene/silicon wafer substrate, the source/drain electrode-patterned nanopatch graphene composite of Example 1-1 was introduced. Finally, the substrate was deposited with a 50 nm-thick organic semiconductor pentacene (Sigma-Aldrich) at a rate of 0.2 Ås$^{-1}$, thereby fabricating a flexible organic transistor including the nanopatch graphene composite.

Device Example 3: Fabrication of Flexible Organic Transistor Including Nanopatch Graphene Composite A flexible organic transistor including the nanopatch graphene composite was fabricated in the same manner as in Device Example 2, with the exception that an organic semiconductor DNTT (dinaphtho[2,3-b:2',3'-f]thieno[3,2-b]

thiophene, Sigma-Aldrich) was deposited on the substrate, in lieu of depositing the organic semiconductor pentacene on the substrate.

Device Example 4: Fabrication of Flexible Organic Transistor Including Nanopatch Graphene Composite A flexible organic transistor including the nanopatch graphene composite was fabricated in the same manner as in Device Example 3, with the exception that an organic semiconductor $C_8$-BTBT (2,7-dioctyl[1]benzothieno[3,2-b] [1]benzothiophene, Sigma-Aldrich) was deposited on the substrate, in lieu of depositing pentacene on the substrate.

Fabrication of Flexible Strain Sensor

Device Example 5: Fabrication of Flexible Strain Sensor Including Nanopatch Graphene Composite Formed on Polydimethylsiloxane (PDMS)

A flexible strain sensor was fabricated by depositing liquid metal (gallium-indium eutectic, product No.: 495425) as both electrodes on the nanopatch graphene composite of Example 1-4.

Comparative Device Example 1: Fabrication of Field Emission Transistor Including Pristine Graphene Thin Film A field emission transistor including the pristine graphene thin film was fabricated in the same manner as in Device Example 1, with the exception that a 60 nm-thick Au electrode was thermally deposited on the pristine graphene thin film manufactured in Comparative Example 1, in lieu of thermally depositing the 60 nm-thick Au electrode on the nanopatch graphene composite manufactured in Example 1-1.

Comparative Device Example 2: Fabrication of Flexible Organic Transistor Including Pristine Graphene Thin Film A flexible organic transistor including the pristine graphene thin film was fabricated in the same manner as in Device Example 2, with the exception that the pristine graphene thin film manufactured in Comparative Example 1 was introduced in lieu of introducing the gate electrode-patterned nanopatch graphene composite (OTS-G) and the source/drain electrode-patterned nanopatch graphene composite.

Comparative Device Example 3: Fabrication of Flexible Organic Transistor Including Pristine Graphene Thin Film A flexible organic transistor including the pristine graphene thin film was fabricated in the same manner as in Device Example 3, with the exception that the pristine graphene thin film manufactured in Comparative Example 1 was introduced in lieu of introducing the gate electrode-patterned nanopatch graphene composite (OTS-G) and the source/drain electrode-patterned nanopatch graphene composite.

Comparative Device Example 4: Fabrication of Flexible Organic Transistor Including Pristine Graphene Thin Film A flexible organic transistor including the pristine graphene thin film was fabricated in the same manner as in Device Example 4, with the exception that the pristine graphene thin film manufactured in Comparative Example 1 was introduced in lieu of introducing the gate electrode-patterned nanopatch graphene composite (OTS-G) and the source/drain electrode-patterned nanopatch graphene composite.

TEST EXAMPLES

Test Example 1: AFM Morphology Analysis

FIG. 3 shows the AFM (Atomic Force Microscopy) images of Example 1-1 and Comparative Example 1, and AFM analysis was performed using a Veeco NanoScope 8.

With reference to FIG. 3, unlike the surface of the graphene thin film of Comparative Example 1, the surface of the nanopatch graphene composite of Example 1-1 can be seen to show many small patches having a size ranging from 2 nm to 25 nm.

Test Example 2: Analysis of Structure of Nanopatch on Nanopatch Graphene Composite FIG. 4A shows a STEM image of Example 1-1 using an energy dispersive spectrometer (EDS), FIG. 4B shows the selected area electron diffraction (SAED) pattern thereof, FIG. 4C shows the results of measurement of grazing incidence X-ray diffraction (GIXD) thereof, and FIG. 4D shows the epitaxial structure of the self-assembled nanopatch layer in graphene.

As shown in FIG. 4A, the silicon atom was present at the position of the self-assembled nanopatch of Example 1-1, and the self-assembled nanopatch was composed of OTS molecules.

As shown in FIGS. 4B and 4D, the crystal structure of the self-assembled nanopatch of Example 1-1 had a hexagonal structure and exhibited weak epitaxy on the graphene surface, and the electron diffraction pattern of the self-assembled nanopatch crystal was distorted by about 14° from the hexagonal pattern of graphene. As shown in FIG. 4C, the OTS structure of the graphene surface was very similar to the OTS structure of the SiO surface.

Thus, the self-assembled nanopatch was configured such that the upper hexagonal OTS structure was formed on the graphene lattice.

Test Example 3: Analysis of UV-Vis Spectra

FIG. 5 shows the results of analysis of UV-vis spectra of Example 1-1 and Comparative Example 1, and the analysis of UV-vis spectra was performed using a CARY-5000 from Varian.

As shown in FIG. 5, the transmittance of the nanopatch graphene composite of Example 1-1 was almost the same as the transmittance of the pristine graphene thin film of Comparative Example 1.

Thus, the high transmittance of the nanopatch graphene composite of Example 1-1 was maintained.

Test Example 4: Measurement of Current-Voltage Change of Graphene Field Emission Transistor FIG. 6A schematically shows a graphene field emission transistor, and FIG. 6B shows the results of current-voltage change in the field emission transistors (VDS=1 mV) of Device Example 1 and Comparative Device Example 1.

As shown in FIGS. 6A and 6B, the average hole mobility values of Comparative Device Example 1 and Device Example 1 were measured to be 8,490 and 9,240 cm$^2$V$^{-1}$s$^{-1}$, respectively, through current-voltage change of the field emission transistor (FET).

Thus, the electrical properties of graphene were maintained even when the self-assembled nanopatch was formed on the surface thereof.

Test Example 5: Comparison of Mechanical Properties of Graphene

FIG. 7A shows the results of nanoindentation of Example 1-1 and Comparative Examples 1 and 2, and FIG. 7B shows the histogram of fracture load.

As shown in FIG. 7A, two-dimensional Young modulus ($E^{2D}$) values of Comparative Example 2, Comparative Example 1 and Example 1-1 were 346, 312 and 356 Nm$^{-1}$, respectively. A higher load was applied in order to fracture the nanopatch graphene composite of Example 1-1, compared to that for fracturing the graphene of Comparative Example 1 or 2.

As shown in FIG. 7B, the fracture load of the nanopatch graphene composite of Example 1-1 was 60% higher than that of the graphene of Comparative Example 1. Thereby, the two-dimensional fracture strength ($\sigma^{2D}$) values of Comparative Example 2, Comparative Example 1 and Example 1-1 were calculated to be 43.5, 39.1 and 52.7 Nm$^{-1}$, respectively, which means that the fracture strength of the nanopatch graphene composite of Example 1-1 was increased by 35% compared to the nanopatch graphene composite of Comparative Example 1.

Thus, in the nanopatch graphene composite according to the present invention, the elastic coefficient (Young modulus) was maintained and the two-dimensional fracture strength was measured and found to be high compared to that of conventional graphene, from which the mechanical properties are evaluated to be greatly improved.

Test Example 6: Difference in Performance of Organic Transistor Due to Introduction of Nanopatch Graphene Composite FIGS. 8A, 8B and 8C are graphs showing the transfer properties of the organic transistors of Device Example 2 and Comparative Device Example 2 (FIG. 8A), Device Example 3 and Comparative Device Example 3 (FIG. 8B), and Device Example 4 and Comparative Device Example 4 (FIG. 8C) (red: Device Examples 2 to 4, black: Comparative Device Examples 2 to 4).

As shown in FIGS. 8A, 8B and 8C, the drain current value and the current on/off ratio were higher in Device Examples 2 to 4 than in Comparative Device Examples 2 to 4.

The performance indexes of the organic transistors of Device Examples 2 to 4 and Comparative Device Examples 2 to 4 are summarized in Table 1 below.

As set forth in Table 1, the organic transistors of Device Examples 2 to 4 exhibited high charge mobility and low electrode contact resistance compared to the organic transistors of Comparative Device Examples 2 to 4.

TABLE 1

| Organic semiconductor | Device | Average hole mobility (cm$^2$/Vs) | Threshold voltage (V) | On/off current ratio | Width normalized contact resistance (MOhm · cm) |
|---|---|---|---|---|---|
| Pentacene | Comparative Device Example 2 | 0.039 (±0.04) | −11.4 (±4.3) | 10$^4$ | 2.1 |
|  | Device Example 2 | 0.14 (±0.03) | −9.8 (±3.7) | 10$^6$ | 0.79 |
| DNTT | Comparative Device Example 3 | 0.16 (±0.11) | −8.3 (±4.3) | 10$^6$ | 1.7 |
|  | Device Example 3 | 0.79 (±0.17) | −8.3 (±4.2) | 10$^7$ | 0.25 |
| C$_8$-BTBT | Comparative Device Example 4 | 0.035 (±0.03) | −1.2 (±3.6) | 10$^6$ | 5.1 |
|  | Device Example 4 | 0.12 (±0.04) | −2.6 (±2.7) | 10$^7$ | 1.4 |

Therefore, the organic transistors of Device Examples 2 to 4 are evaluated to exhibit superior performance compared to the organic transistors of Comparative Device Examples 2 to 4.

Test Example 7: Changes in Molecular Alignment of Organic Semiconductor

FIG. 9 shows the results of analysis of two-dimensional grazing incidence X-ray diffraction patterns of Device Examples 2 and 3 and Comparative Device Examples 2 and 3.

As shown in FIG. 9, the organic semiconductor was subjected to vertical alignment relative to the substrate in Device Examples 2 and 3, and to planar alignment relative to the substrate in Comparative Device Examples 2 and 3. Upon vertical alignment, the charge transport becomes favorable in a transverse direction at the interface between the electrode and the channel. In the planar alignment, charge transport near the electrode may be adversely affected.

Thus, the molecular alignment of the organic semiconductor layer growing on the nanopatch graphene composite of Device Examples 2 and 3 was induced so as to become favorable for charge injection, whereby the performance of the organic transistor device was increased.

Test Example 8: Comparison of Electrical Properties of Nanopatch Graphene Composite Through Graphene Transfer Followed by Nanopatch Formation and Through Nanopatch Formation Followed by Graphene Transfer FIG. 10 is a schematic view showing the measurement of resistance of the nanopatch graphene composites of Examples 1-1 and 1-2.

As shown in FIG. 10, the nanopatch graphene composite of each of Examples 1-1 and 1-2 was transferred onto the PET film, in lieu of transfer onto the $SiO_2$/Si wafer, after which the Au electrode was patterned and the resistance thereof was measured. The average resistance measurements were 0.301 ohm and 0.372 ohm, which are similar to each other.

Thus, the nanopatch graphene composites of Examples 1-1 and 1-2 exhibited similar electrical properties.

Test Example 9: Evaluation of Bendability, Stretchability and Tensile Strain of Graphene FIG. 11A shows the bending test system of a bending radius of 5 mm in Example 1-3 and Comparative Example 1, and FIG. 11B shows the results of measurement of electrical resistance under repeated bending strain of 5 mm. Also, FIG. 12A shows a stretching test system (scale bar, 2 cm) using a PDMS substrate in Example 1-4 and Comparative Example 1, and FIG. 12B is a graph showing the results of measurement of resistance under tensile strain.

As shown in FIGS. 11A and 11B, the pristine graphene thin film manufactured in Comparative Example 1 was drastically increased (30~50%) in electrical resistance after 10 repeated bending processes, whereas the nanopatch graphene composite of Example 1-3 exhibited an increase in electrical resistance of only 10% upon about 1000 bending processes.

As shown in FIGS. 12A and 12B, the pristine graphene thin film manufactured in Comparative Example 1 exhibited a drastic resistance increase from 3% stretching under direct tensile strain, but the nanopatch graphene composite manufactured in Example 1-4, stretched the same amount, exhibited resistance stability that was increased at least 1000 times.

For bending and stretching, the nanopatch graphene composites manufactured in Examples 1-3 and 1-4 manifested superior mechano-electric stability compared to the pristine graphene thin film manufactured in Comparative Example 1.

Test Example 10: Changes in Resistance of Flexible Strain Sensor Including Nanopatch Graphene Composite Formed on Polydimethylsiloxane (PDMS)

FIGS. 13A and 13B are graphs showing changes in resistance depending on the movement of Device Example 5 attached to the finger and the back of the hand, respectively.

As shown in FIGS. 13A and 13B, the flexible strain sensor of Device Example 5 is able to adequately convert changes in strain depending on the movement of the finger and the back of the hand into an electrical signal within a significant time range.

Thus, based on the performance of the flexible strain sensor of Device Example 5, the nanopatch graphene composite of the invention can be found to be efficiently applicable to the sensor.

The scope of the invention is represented by the claims below rather than the aforementioned detailed description, and all of the changes or modified forms that are derived from the meaning, range, and equivalent concepts of the appended claims should be construed as being included in the scope of the present invention.

What is claimed is:

1. A nanopatch graphene composite, comprising:
   a graphene including a defect; and
   a nanopatch disposed on the defect,
   wherein the defect is at least one selected from the group consisting of a grain boundary, a dot defect, a line defect, cracking, folding, and wrinkling, and
   the nanopatch includes a self-assembled monolayer (SAM).

2. The nanopatch graphene composite of claim 1, wherein the self-assembled monolayer is formed by self-assembling, on the defect, a compound represented by Chemical Formula 1 below:

[Chemical Formula 1]

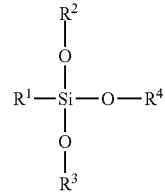

in Chemical Formula 1,
$R^1$ is a C3 to C30 alkyl group,
$R^2$ and $R^3$, which are identical to or different from each other, are independently a hydrogen atom or a C1 to C6 alkyl group, and
$R^4$ is a C1 to C6 alkyl group.

3. The nanopatch graphene composite of claim 2, wherein the compound represented by Chemical Formula 1 is octadecyltrimethoxysilane (OTS).

4. The nanopatch graphene composite of claim 1, wherein the nanopatch suppresses or delays fracture of the graphene growing on the defect upon transforming the graphene.

5. The nanopatch graphene composite of claim 1, wherein the graphene is at least one selected from the group consisting of single-layer graphene, double-layer graphene and multilayer graphene.

6. An organic transistor, comprising:
   a flexible substrate;
   a semiconductor layer on the flexible substrate; and
   a gate electrode, a source electrode and a drain electrode,
   wherein at least one selected from the group consisting of the gate electrode, the source electrode and the drain electrode includes the nanopatch graphene composite of claim 1.

7. The organic transistor of claim 6, wherein the flexible substrate is at least one selected from the group consisting of polydimethylsiloxane, polyimide, polyethylene terephthalate, polyethylene naphthalate, polypropylene, polyethylene, polyamide and fiberglass-reinforced plastic.

8. A flexible strain sensor, comprising:
a flexible substrate;
an active layer formed on the flexible substrate and including the nanopatch graphene composite of claim 1; and
an electrode electrically connected to the active layer.

9. A method of manufacturing a nanopatch graphene composite, comprising:
(a) providing graphene including a defect;
(b) oxidizing the graphene to form a functional group containing an oxygen atom on the defect, thus obtaining surface-modified graphene; and
(c) bonding a self-assembled monolayer to the functional group, thus obtaining the nanopatch graphene composite.

10. The method of claim 9, wherein, in step (c), the self-assembled monolayer is formed by self-assembling a compound represented by Chemical Formula 1 below:

[Chemical Formula 1]

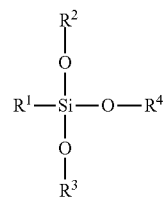

in Chemical Formula 1, $R^1$ is a C3 to C30 alkyl group, $R^2$ and $R^3$, which are identical to or different from each other, are independently a hydrogen atom or a C1 to C6 alkyl group, and $R^4$ is a C1 to C6 alkyl group.

11. The method of claim 9, wherein the oxidizing is selectively carried out on the defect of the graphene.

12. The method of claim 11, wherein the oxidizing is performed using UV/ozone.

* * * * *